(12) United States Patent
Wong et al.

(10) Patent No.: US 7,791,339 B2
(45) Date of Patent: Sep. 7, 2010

(54) RF-SWITCHED SUPERCONDUCTING RESONATORS AND METHODS OF SWITCHING THEREOF

(75) Inventors: Wai Ha Wong, San Jose, CA (US); Richard Stacy Withers, Sunnyvale, CA (US); Weston A. Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 514 days.

(21) Appl. No.: 11/899,706

(22) Filed: Sep. 7, 2007

(65) Prior Publication Data
US 2009/0302846 A1 Dec. 10, 2009

(51) Int. Cl.
*G01V 3/00* (2006.01)
(52) U.S. Cl. .................................. 324/307; 324/309
(58) Field of Classification Search ......... 324/300–322; 600/407, 422; 505/90, 220, 231, 892; 335/300, 335/299, 216; 333/229, 235
See application file for complete search history.

(56) References Cited
U.S. PATENT DOCUMENTS
4,763,076 A 8/1988 Arakawa et al.
6,377,044 B1 * 4/2002 Burl et al. ............... 324/307
6,690,394 B1 2/2004 Harui
6,727,702 B2 * 4/2004 Hammond et al. .......... 324/318
7,268,099 B1 * 9/2007 de Rochemont ........... 505/230
7,372,273 B2 * 5/2008 Huang et al. ................. 324/318
7,511,497 B2 * 3/2009 Wosik et al. ................. 324/318

* cited by examiner

*Primary Examiner*—Brij B Shrivastav
(74) *Attorney, Agent, or Firm*—Bella Fishman

(57) ABSTRACT

A multimode resonator resonating at two or more frequencies is operated at cryogenic temperatures and composed of a superconducting material or a normal metal with a superconducting section serving as a RF superconducting switch. The multimode resonator is coupled to a NMR spectrometer and a RF switch power source, wherein its one frequency is selected to correspond to the operating frequency of the NMR spectrometer and at least a second frequency is tuned to a frequency of RF switch power source, unrelated to the spectrometer frequency, therefore power at this frequency does not perturb the operation of the spectrometer. When activated, the RF switch power source induces a current sufficient to approach or exceeds the critical current in one or more sections of the superconducting material of the multimode resonator, thereby increasing its resistance and reducing the Q factor of the multimode resonator.

23 Claims, 4 Drawing Sheets

RF-SWITCHED SUPERCONDUCTING RESONATORS AND METHODS OF SWITCHING THEREOF

FIELD OF THE INVENTION

The present invention relates to nuclear magnetic resonance (NMR) technology utilizing radio frequency (RF) resonators fabricated from superconducting materials.

BACKGROUND OF THE INVENTION

A conventional NMR detection system uses a magnet, a probe and a spectrometer. The magnet polarizes the sample by producing a strong magnetic field in a sample region. Superconducting magnets produce the strongest magnetic fields, and operate at low temperatures requiring a Dewar and cryogenic equipment. The probe is positioned within the magnet and supports the sample and the RF coils or resonators generating and detecting the RF magnetic fields used to stimulate and detect the resonance signals from the nuclear spins. Probes with cryogenic resonators also contain a Dewar system and a temperature control system that maintains a very low temperature environment for these resonators and maintain a near room temperature environment for the sample. Cryogenic resonators comprise cold normal metal resonators or high temperature superconducting (HTS) resonators that operate at temperatures below 100 K and typically in the range of 20 to 30 K. The resonator comprises an inductive section usually in the form of a coil and a capacitive section that may be in the form of distributed capacity or a separate capacitor. The NMR spectrometer comprises electronic circuits with a transmitter to generate RF energy that is applied to a transmitter resonator, a RF receiver used to amplify and detect any NMR signals induced into a receiver resonator, recording, and display circuits for handling, storing and displaying the NMR data, and a controller that can be programmed to carry out the desired experiment. The controller can also be used to control accessories that may be added, such as sample changers and a RF switch power source.

NMR is a powerful technique for analyzing molecular structure. The technology is also used in magnetic resonance imaging (MRI) to study physical structures and blood flow patterns. It is also an insensitive technique, compared to other techniques, for structure determination. To gain maximum sensitivity, NMR magnets and spectrometers are designed to operate at high magnetic field strengths, employ low noise preamplifiers and RF probes with cryogenic resonators that operate at cryogenic temperatures. The cryogenic resonators use cold normal metal transmitter/receiver coils or preferably transmitter/receiver coils made with high temperature superconducting (HTS) materials operating at low temperatures. The transmitter/receiver coils are the probe coils that stimulate the nuclei and detect the NMR response from the sample, and therefore are placed very close to the sample to provide high sensitivity. The cryogenically cooled normal metal coils and the HTS coils have the highest quality factor, Q, and yield the best sensitivity.

In a typical experiment one or more RF transmit pulses are applied to the probe resonator to excite a selective nuclear resonance signal. This is followed by a reception period where the transmitter is silent and the receiver is activated to detect and record any response signal produced by the nuclei. In some systems the same coil or resonator is used to produce the transmit RF magnetic field and to receive the response signal of the nuclei. In other systems separate resonators are used for transmitter and receiver. In some imaging systems a single transmitter RF coil or resonator is used for exciting the nuclei, and one or more receiver coils or resonators are used to detect the response. In these systems the transmitter coil or resonator be operational at cryogenic temperatures or at near room temperatures. The receiver resonators are normally arranged to provide little or preferably no coupling with the transmitter resonator. This is done to prevent the receiver resonator from distorting the RF field produced by the transmitter resonator. Any small residual coupling between the transmitter and receiver resonators allows for a RF voltage to be induced in the windings of the receiver coil or resonator which in turn causes a circulating current to flow through the receiver coil windings producing a RF field in the sample region thereby distorting the RF field produced by the transmitter resonator. Residual coupling between the transmitter and receiver coils reduces the sensitivity during the receive phase since the small NMR signal currents in the receiver coil windings induce currents in the transmitter coil windings causing a loss in sensitivity. Direct coupling of the RF fields produced by the precessing nuclei also induce currents in the transmitter coil causing a loss in sensitivity. In systems with multiple receiver coils it may also be desirable to minimize the coupling between separate receiver coils.

In systems that use the same coil or resonator for transmit and receive another problem can occur. After a transmit pulse, the energy remaining in the transmitter coil decays with a time constant $\tau = Q/\omega$, where $\omega$ is the RF frequency in radians/second and Q is the quality factor of the transmitter coil. This energy causes a distortion of the NMR signal if the receiver is activated before this transmitter energy has sufficiently decayed.

In NMR probes with cold normal metal coils or superconducting transmitter and receiver coils these problems can be particularly severe as the coil Q-values in these probes are particularly high thereby increasing the time constant $\tau$ and the effect of any coupling between coils. In simple resonator systems Q can be defined as the ratio of inductive (or capacitive) reactance to the coil resistance. Since superconducting coils have very low resistance at RF frequencies, the Q-values are high. By reducing the Q the effect of this mutual coupling is reduced, however it is desirable to do this without reducing the sensitivity of the probe that is gained by the high Q-values. By causing a small section of a superconducting coil to become non-superconducting either by increasing the current through the section above its critical current or by increasing its temperature of the section above the superconducting critical temperature, $T_C$, introduces more resistance into that section thereby reducing the Q of the coil. Even before the current exceeds the critical current, the HTS material becomes non-linear showing an increase in inductance and a small increase in resistance. In some cases these smaller changes may be adequate to achieve a desired reduction of coil Q or detuning of the coil.

To gain this advantage of high Q-values and reduce the detrimental effects, it is desirable to reduce the Q of the transmitter resonator while the receiver resonator maintains a high Q-value during the receive phase. Similarly it is desirable to reduce the Q of a receiver resonator while the transmitter is applying a RF field to the nuclei. Any RF currents induced in the receiver resonator by the transmitter pulse will produce an additional RF field in the sample region that distorts the RF field produced by the transmitter resonator.

In many cases the direct coupling of the transmitter resonator to the receiver resonator cannot be sufficiently eliminated to avoid the above problem. U.S. Pat. No. 4,763,076 teaches to use switching diodes to selectively connect and disconnect portions of an RF resonant circuit in response to a DC control signal to change the Q-value and frequency of a resonant circuit. The DC control signal selectively forward biases and reverse biases the switching diodes. The use of switching diodes appears practical in normal metal RF resonators operating at room temperature, but do not appear practical in systems using cryogenic resonators. Placing diodes in these circuits greatly lowers their quality factor Q thereby largely eliminating the advantage of cryogenic resonators.

U.S. Pat. No. 6,727,702 B2 describes various methods to "de-Q", i.e. reduce the Q-value of HTS coils used in MRI by heating a short section of the superconducting trace to a temperature above its critical temperature Tc. While heated above its Tc, the superconductor loses its superconductivity, and the electrical resistance of that section greatly increases thereby lowering the quality factor Q of the coil. An additional method is disclosed that relies on heat generated by an RF transmit pulse to switch a superconductor in a circuit out of a superconducting state. If a superconducting resonator receives enough RF energy from a transmit pulse, the resultant electrical current will exceed the superconducting critical current in one or more points in the circuit heating the material above the critical temperature making it much more resistive. This increase in resistance will limit the RF power absorbed by the inductor. The switching on-to-off and off-to-on times occur on a fast enough to limit absorption from the transmit pulse, while recovering in time to receive the RF signal. The circuit may comprise one or more of these switches with points with reduced critical current formed by a narrowing of the line-width of a section of the superconducting coil or by damage of the superconducting material within a restricted area forming a so called superconducting RF switch.

The technique of using the current induced in a receiver coil by the transmitter pulse to reduce the Q of the receiver coil might be applicable in a few situations, however normally the current induced in the receiver coil by a transmit pulse remains below the critical current in the coil even if the receiver circuit has a superconducting RF switch. The technique is not practical in the inverse situation, i.e. to reduce the Q of the transmitter coil by currents induced in the receiver coil. The currents induced in the transmitter coil either directly or indirectly by the nuclear signals are far too small produce a current sufficiently strong to cause a section of the transmitter coil or RF switch to exceed the critical current and become a normal conductor. Also the technique is not applicable to reducing the decay time τ, after a transmit pulse.

SUMMARY OF THE INVENTION

The present invention addresses these and other problems associated with the prior art and overcomes its limitations of using the NMR transmitter pulse to reduce the Q factor of the receiver resonator. The present invention also meets the needs to reduce the Q factor of the transmitter resonator after a transmit pulse or while receiving by employing a cryogenic multimode resonator that is coupled to a NMR spectrometer and to a RF switch power source. This multimode resonator resonates at two or more independent frequencies. The first resonant frequency corresponds to the NMR frequency of the spectrometer. Another resonant frequency corresponds to a frequency of the RF switch power source, which is generally higher in value than the first one. A RF switch made of HTS material forms a section of the cryogenic multimode resonator. Activation of the RF switch power source produces a current in the multimode resonator that approaches or exceeds the critical current of the RF switch, causing the superconducting material of the RF switch to become a non-superconducting thereby increasing its resistance and lowering the quality factor Q of the multimode resonator.

The multimode resonator is operated at cryogenic temperatures and is formed from normal metals or from superconductors using HTS materials. In the case of HTS multimode resonators, the RF switch may comprise one or more sections of the HTS resonator. In the case of normal metal multimode resonator operating at cryogenic temperatures, a separate HTS RF switch forms part of the multimode resonator.

BRIEF DESCRIPTION OF THE DRAWINGS

The foregoing aspects of the present invention will become better understood upon reading the following detailed description and upon reference to the drawings.

DETAILED DESCRIPTION OF THE INVENTION

Figure 1:
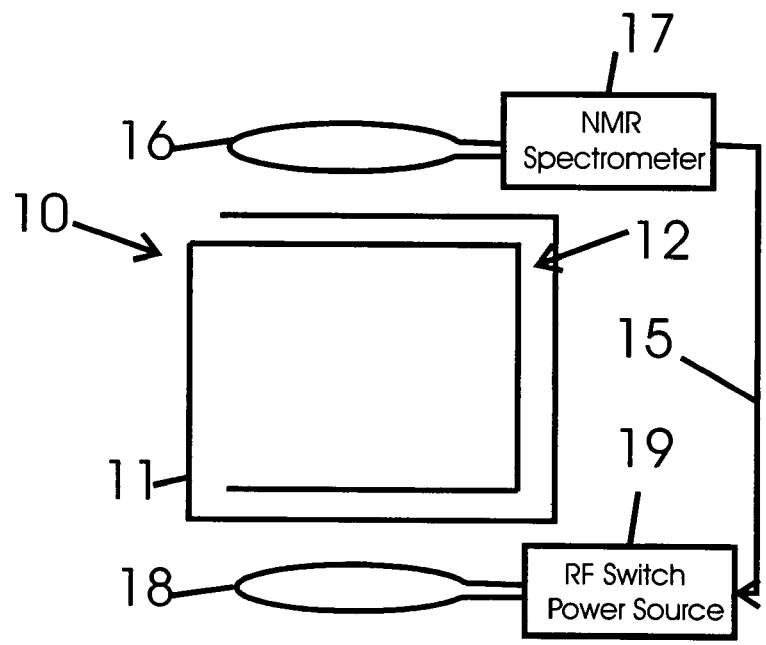
FIG. 1 is a schematic diagram of a superconducting multimode resonant circuit illustrating one aspect of the present invention.

Turning to the drawings, FIG. 1 illustrates an exemplary RF coil of the NMR probe, which is a HTS multimode resonator 10, with distributed inductance and capacitance 12, resonates at a fundamental frequency and at one or more higher frequencies. As described below, other resonator configurations also may have more than one resonant frequency mode. Normally the lowest frequency mode is used for the NMR transmit and receive functions, and the higher frequency modes are ignored or tuned such that they do not perturb the NMR experiment. The HTS multimode resonator 10 is coupled to the NMR spectrometer 17 by coupling loop 16 and to an RF switch power source 19 by coupling loop 18. The RF frequency of the RF switch power source 19 is tuned to one of the higher frequency modes of resonator 10. The Q factor of HTS multimode resonator 10 is decreased by activating the RF switch power source 19 thereby inducing a RF current in the windings of resonator 10 that is approaching or above the critical current at one or more sections of the coil windings. When the RF current is near the critical current of one or more sections of the windings, the resistance and inductance of that section increases. When the current exceeds the critical current of a section of the winding, the section becomes non-superconducting and the resistance of that section greatly increases thereby decreasing the Q factor of resonator 10. The RF switch power source 19 may be activated at any desired point in the sequence of spectrometer operations. At the appropriate point, the NMR spectrometer 17 activates the RF switch power source 19 by sending an activation signal to it on control line 15.

A superconducting RF switch may be incorporated into the resonator 10 that will give the designer more flexibility in selecting the optimum RF power of the RF switch power source 19. The RF switch is fabricated by narrowing a section of the resonator winding 11, or an improved switch may be fabricated as described below in reference to FIGS. 6A-6B.

HTS multimode resonator 10 shown in FIG. 1 serves as both the transmitter and receiver resonators in the NMR probe. In this embodiment the RF switch power source 19 is activated by a signal on control line 15 from the NMR spectrometer 17 that occurs at the end of the transmit pulse and before the receiver is activated. The RF switch power induced into HTS multimode resonator 10 causes a section of winding 11 to become more resistive or become non-superconducting thereby lowering the Q factor of multimode resonator 10. The lower Q factor of the resonator during this period quickly reduces any remaining RF energy in the resonator before the receiver is switched on. This process greatly shortens the time delay required between the end of the transmit signal and the time the receiver is activated, resulting in greater sensitivity of the NMR spectrometer system.

There is always a section of an HTS resonator that will act as an RF switch with sufficient RF power from the RF switch power source. Alternatively a superconducting RF switch may be formed at a specific location or section in resonator structure 10 by narrowing the width of the HTS resonator the selected section and coating the narrowed portion with a normal metal material as described below with reference to FIGS. 6A and 6B, thereby giving the designer more flexibility in selecting the optimum RF power level required of RF switch power source 19.

Figure 2:
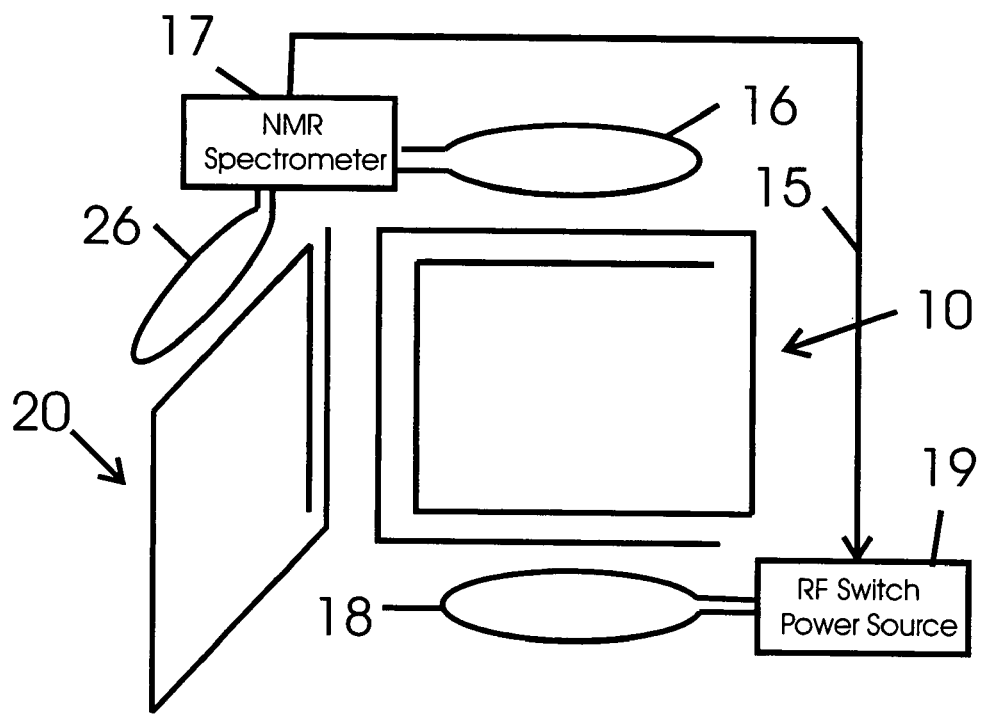
FIG. 2 is a schematic diagram of a superconducting multimode resonant circuit with an additional resonator tuned to the NMR frequency illustrating another aspect of the present invention.

In systems with separate transmitter and receiver coils, resonator 10 may serve either as the transmitter resonator or receiver resonator. As illustrated in FIG. 2, additional resonator 20 serves as receiver resonator or transmitter resonator, respectively. Each configuration will be illustrated with reference to FIG. 2, which illustrates additional aspects of the present invention.

According to one embodiment HTS multimode resonator 10 is the receiver resonator and additional resonator 20 is the transmitter resonator. In high resolution NMR systems resonator 20 would typically be a cryogenic resonator. In some MRI systems resonator 20 would be a non-cryogenic resonator operating at near room temperatures. The NMR spectrometer is coupled to resonator 20 by coupling loop 26. During the transmit phase of the NMR experiment, RF switch power source 19 is activated by the NMR spectrometer via control line 15 lowering the Q factor of multimode (receiver) resonator 10 and reducing currents in this resonator are induced from coupling to HTS additional (transmitter) resonator 20 thereby reducing any RF magnetic fields produced by these currents. As a result, the distortion of the RF magnetic field by undesired currents in the receiver resonator is reduced.

In another embodiment HTS multimode resonator 10 is the transmitter resonator and an additional resonator 20 is the receiver resonator. During the receive phase of the NMR experiment, RF switch power source 19 is activated by the NMR spectrometer via control line 15 lowering the Q factor of HTS multimode (transmitter) resonator 10 and reducing any signal currents that are induced in it. Signal currents from the nuclear spins that are induced into the transmitter resonator during the receive phase reduces the sensitivity of NMR spectrometer system.

In yet another embodiment a superconducting RF switch is fabricated directly into HTS resonator 10 by narrowing a selected section of the resonator. The geometry of this narrow section should be sufficient for inducing therein by RF switch power source an adequate volume of the critical current prior to any other sections of the resonator. A second condition is that the selected section should not be so narrow that it becomes normal during the operation of the NMR spectrometer, yet operates with a minimum of power required from the RF switch power source.

The multimode resonator systems shown in FIGS. 1 and 2 illustrate exemplary designs among a number of modifications of cryogenic multimode resonators that may be used to practice the present invention, where a suitable resonator must have two or more resonant frequency modes. One of the modes must be capable of producing a relatively uniform RF magnetic field in the NMR sample region. One of the other modes must be sufficiently removed in frequency so that any RF field it produces does not perturb the NMR experiment.

Figure 3A:
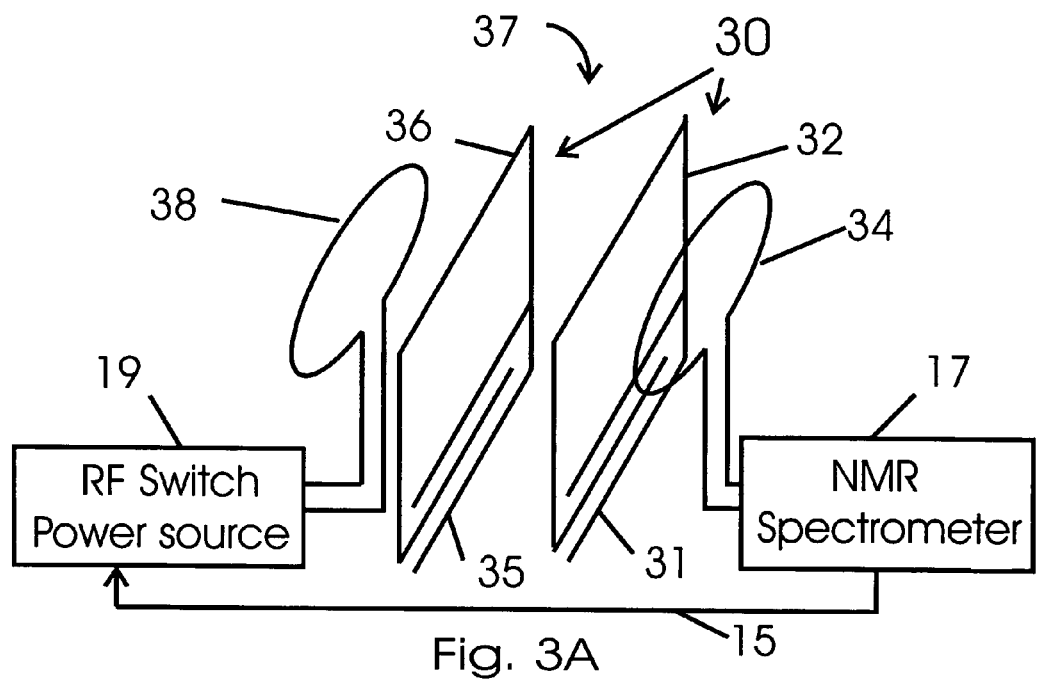
FIG. 3A is schematic diagram of a multimode resonant circuit comprising two coupled HTS resonators, with one resonant frequency tuned to the spectrometer frequency and a second resonant frequency tuned to a RF switch power source.

FIG. 3A illustrates a suitable cryogenic resonator that is used in many high resolution NMR probes. Multimode resonator 30 includes two identical superconducting resonators, with coil sections 32 and 36, and capacitor sections, 31 and 35 that straddle the NMR sample region 37. The coil sections have a mutual coupling thereby splitting the resonant frequency of an isolated resonator coil into two resonant frequencies, one at a lower frequency $F_L$ in which the RF fields of the two coils add and are symmetric with respect to the center of the coil system, and a second higher frequency at a higher frequency, $F_H$, in which the RF fields subtract, resulting in an anti-symmetric RF with respect to the center of the coil system resulting in a zero field at the center of the sample region 37. Here-to-fore this second higher frequency has not proven to be useful. The present invention makes use of this higher frequency as a means to "de-Q", i.e. to reduce the Q factor of resonator 30.

In one embodiment HTS multimode resonator 30 serves as both the transmitter and receiver resonator in a NMR probe. The NMR spectrometer 17 operates at the lower resonant frequency $F_L$ of multimode resonator 30. In operation a transmit RF pulse is generated in NMR spectrometer 17 and is coupled into HTS resonator 30 via coupling loop 34. This produces an RF magnetic field in the sample region 37 between coils 32 and 36. After the transmit pulse has terminated, a waiting period is implemented while the energy remaining in resonator 30 dissipates. In high Q factor HTS coils it may take many tens of microseconds before the energy has sufficiently dissipated so that the NMR receiver may start obtaining valid data. This time delay is greatly reduced by the present invention. The RF switch power source 19 is tuned to the higher resonant frequency, $F_H$, of HTS resonator 30. At the end of the transmit pulse the RF switch power source 19 is activated. The RF power from RF switch power source 19 is coupled into resonator 30 by coupling loop 38 causing RF currents to flow in resonator 30 that are sufficiently strong to cause one or more sections to become non-superconducting thereby greatly reducing the Q of resonator 30. This process greatly shortens the time required to dissipate the remaining energy in the resonator thereby reducing delay between the end of the transmit pulse and the start of the data taking phase by the receiver resulting in improved spectrometer system sensitivity.

In a second modification of this resonator configuration, HTS resonator 30 transmits RF from the spectrometer to the nuclear spins and a separate resonator (as in FIG. 2 but not shown in FIG. 3A) is used to receive the nuclear resonance signals. HTS resonator 30 serves as the transmit resonator that receives RF power at the lower frequency $F_L$ from the spectrometer transmitter via loop 34 and converts the RF power to a RF magnetic field that stimulate the nuclear spins. To prevent resonator 30 from absorbing power from the nuclear spins during the receive phase, RF switching power at the higher frequency $F_H$ is applied via loop 38 inducing RF currents in resonator 30. The RF current induced in the two coils 32 and 36 of resonator 30 is sufficiently strong to cause one or more sections of coil 32 or 36 to exceed its critical current and thereby increase the resistance and lower the Q factor and detune resonator 30 and thereby reducing the power it absorbs from the nuclear spin precession.

In yet another modification, multimode resonator 30 of FIG. 3A serves as the receiver resonator in an NMR probe, with a separate transmitter resonator, not shown in FIG. 3A, but as described and illustrated with FIG. 2. In this configuration any coupling between the receiver resonator 30 and the transmitter resonator will induce a voltage in the receiver resonator 30 during the transmit phase of the NMR experiment. Applying RF switch power at the higher frequency $F_H$ to resonator 30 during the transmit phase causes a section of coil 32 or 36 to exceed its critical current, reducing the Q of receiver resonator 30. The lower Q reduces any currents in resonator 30 at frequency $F_L$ thereby preventing these currents from distorting the RF field configuration produced by the transmitter coil.

Figure 3B:
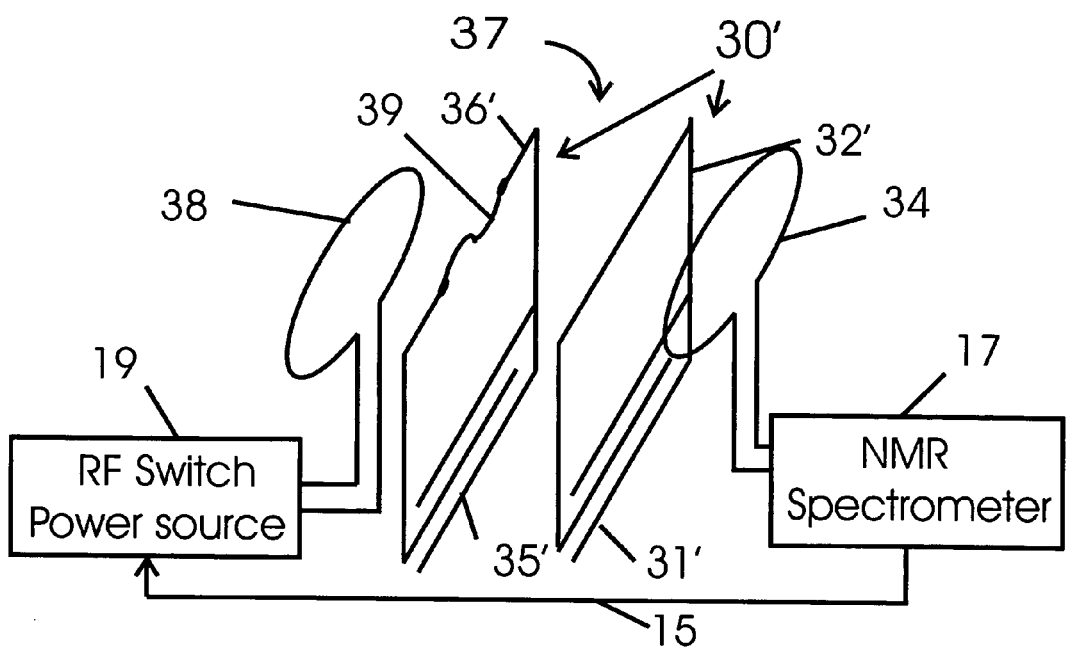
FIG. 3B is a schematic diagram of a multimode resonant circuit comprising two cryogenic resonators, one of the resonators includes an HTS RF switch.

FIG. 3B illustrates a cryogenic multimode coil 30' incorporates a HTS RF switch, 39, into resonator 30'. The coil configuration similar to one, which shown in FIG. 3A except the multimode resonator 30' of FIG. 3B may comprise two identical cryogenic normal metal resonators with coil sections 32' and 36', and capacitor sections, 31' and 35' that straddle the NMR sample region 37. In this embodiment HTS RF switch 39 is incorporated into coil section 36', however it could have been incorporated into coil 32', or into both coils. The HTS RF switch 39 is fabricated from a section of HTS material as described below in connection with FIGS. 6A & 6B. The modes of operation of embodiment of FIGS. 3A and 3B are the same.

Figure 4:
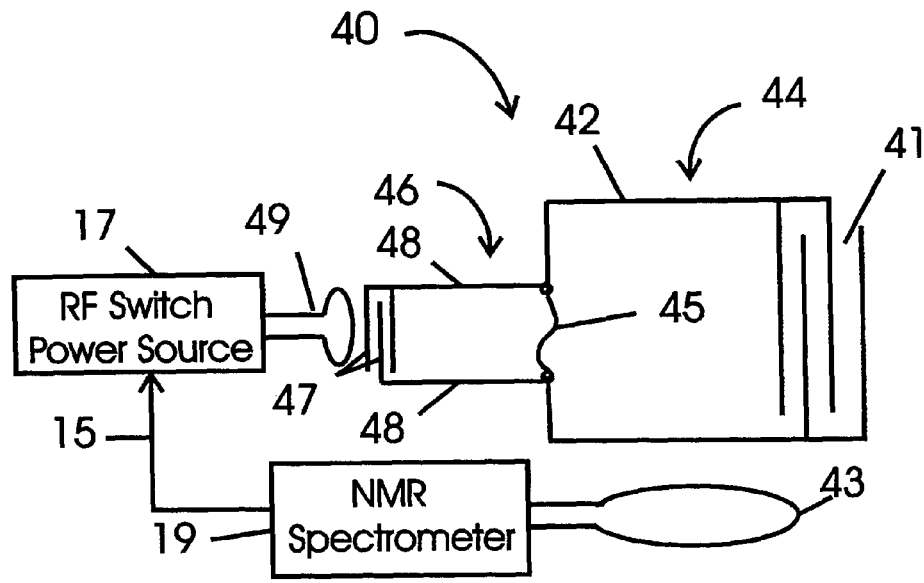
FIG. 4 is a schematic diagram of a cryogenic multimode resonator system using two cryogenic resonant circuits with a common HTS RF switch, one of the resonant circuits is tuned to and coupled to a NMR spectrometer, the other resonant circuit tuned to and coupled to a RF switch power source, illustrating another embodiment of the invention.

A further embodiment of this invention is illustrated in FIG. 4. Cryogenic multimode resonator 40 includes cryogenic resonators 44 and 46. Cryogenic resonator 44 includes a capacitive section 41, inductive section 42, and a HTS RF switch 45. Switch 45 is also common to cryogenic resonator 46 that also includes capacitive section 47 and inductive sections 48. Cryogenic resonator 44 is coupled via loop 43 to the NMR spectrometer 19, and is tuned to the spectrometer frequency, F1. Cryogenic resonator 44 is used as either the transmitter resonator or the receiver resonator, or both, in an NMR probe. Cryogenic resonator 46 is tuned to a different frequency, F2 that does not disturb the nuclear resonance signal. It is coupled to RF switch power source 17 by means of coupling loop 49. Activation of RF switch power source 17 induces sufficient current into resonator 46 and switch 45 to approach or exceed the critical current of the switch causing it to become non-linear or non-superconducting thereby reducing the Q factor of resonator 44 and changing its resonant frequency. As with the coil configuration of FIG. 3A, resonator 44 may be used as both a transmitter and receiver coil, or as a transmitter coil only or a receiver coil only with the same benefits as described above in connection with FIGS. 2 and 3A.

Figure 5:
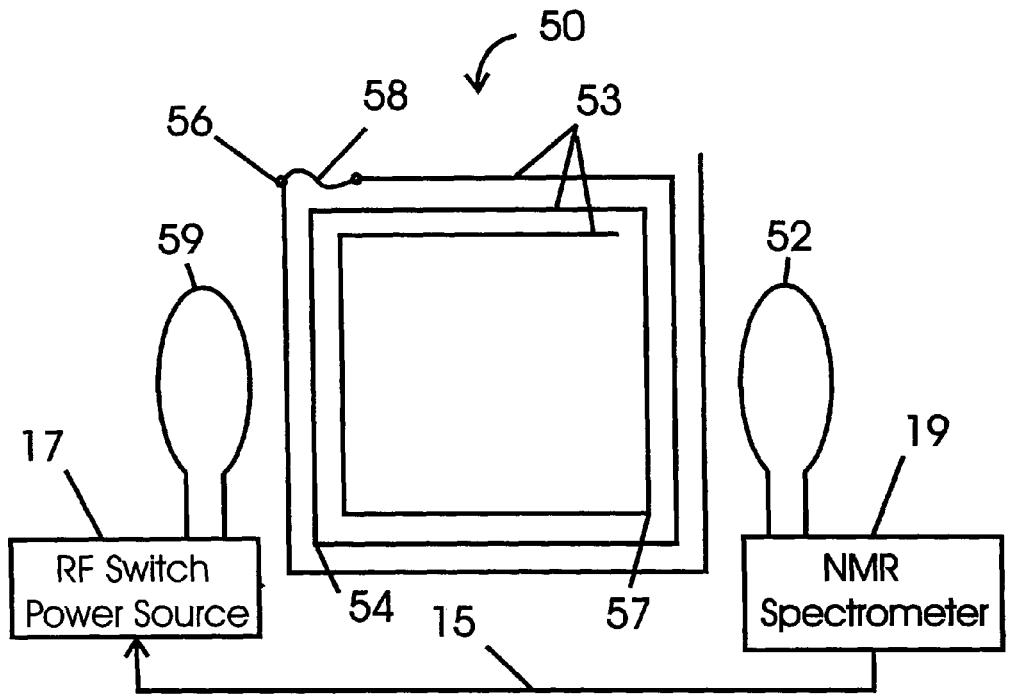
FIG. 5 is a spiral cryogenic multimode resonant circuit with a fundamental frequency mode and higher frequency modes and a superconducting RF switch to de-Q the fundamental frequency mode.

Cryogenic multimode resonator 50 of FIG. 5 is a spiral resonator that has a fundamental mode of frequency $F_0$. This mode has a current maximum at the center of spiral 54 as disclosed in the U.S. Pat. No. 6,690,394. The first order mode $F_1$ resonates at a frequency that is twice or more the frequency of the fundamental mode $F_0$, and has a node at the spiral center 54, and maximum currents at coil positions 56 and 57. RF HTS switch 58 is located at coil position 56. A high power RF signal at frequency $F_1$ is produced by RF switch power source 17 and applied to multimode resonator 50 via loop 59 producing a RF current at switch 58 that is near or above its critical current thereby increases the resistance of the resonator 50 and reducing it's Q value. As with the coil configuration of FIGS. 3A and 3B, resonator 50 may be used in a single resonator probe as the transmitter and receiver resonator, or as a transmitter resonator to stimulate resonance with a separate receiver or as a receiver resonator with a separate transmitter resonator with the same advantages as described in connection with FIG. 3A.

Figure 6A:
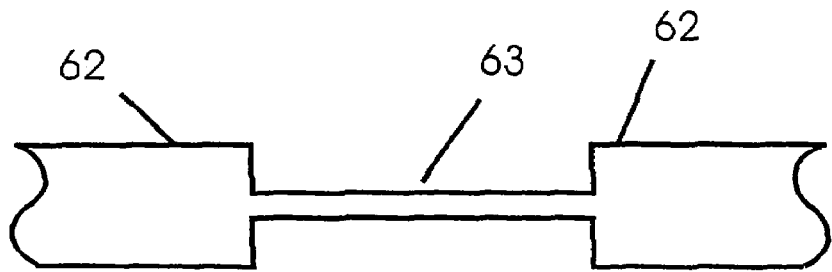
FIG. 6A is a top view of a superconducting RF switch made of the HTS material.
Figure 6B:
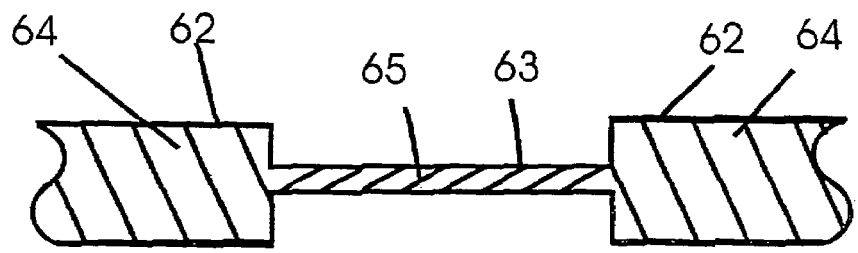
FIG. 6B is a top view of the RF switch made of the HTS material and comprising a top layer of a normal metal material.
Figure 6C:
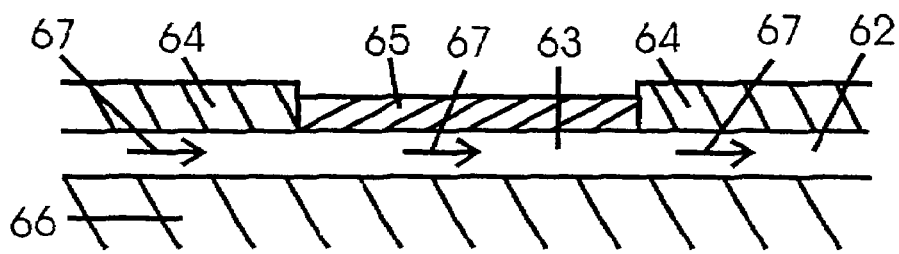
FIG. 6C is a side view of an RF switch indicating the current flow when the switch is in the superconducting state.
Figure 6D:
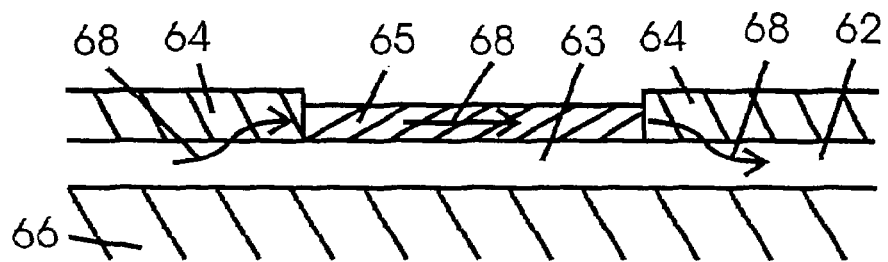
FIG. 6D is a side view of the RF switch with the layer of normal metal material indicating the current flow when this RF switch is in the non-superconducting state.

As mentioned above a superconducting RF switch can be fabricated by narrowing a selected section of the resonator as suggested in U.S. Pat. No. 6,727,702 B2. The value of the Q factor however could not be controlled as it depended upon the resistance of the switched area and no means was provided to control this resistance. One embodiment of the present invention includes an improved RF switch as shown in FIGS. 6A and 6B. A superconducting lead 62 has a narrowed section 63 as indicated in FIG. 6A. The lead 62 may be part of the inductive section of a multimode resonator or it may form part of a separate superconducting switch in series with the coil section of a cryogenic normal metal resonator. When connected with a cryogenic normal metal resonator, the leads 62 may serve as bonding pads for attaching it to the normal metal leads. The leads 62 may or may not be coated for bonding or for protection with a metal overlay 64 as indicated in FIG. 6B. The narrowed section 63 of the lead is coated with a layer having a predetermined thickness of a metal, 65, to provide the desired resistance when an RF current activates the switch to its non-superconducting state. The resistance of the switch in the non-superconductive state is determined by the parallel combination of the resistance on the superconductive material when in the non-superconductive state (which is normally quite high) and the resistance of the metal overlay. The resistance of the metal overlay is determined by the resistivity of the metal used, its thickness, and the width of the overlay and the length of the narrowed region. These parameters may be chosen to provide the desired resistance when the switch is in the non-superconducting state. FIG. 6C is a not to scale diagram of the cross section of the RF switch. The superconducting material of the switch, 62 and 63 are formed on the dielectric substrate 66 that typically has a thickness of about 0.020". The overlay of the superconductor leads 62 might typically be 50 to 300 nanometers of gold or silver, and the thickness of the metal overlay of the switch 65 is chosen to optimize the switch characteristics. With no RF switch current, the current flow of the normal transmit or receive currents are indicated by arrows 67 of FIG. 6C. When the RF switch current is applied the resistance of the switch is much higher as the current is diverted from the superconductor in region 63 and flows now in resistive region 65 of the switch as indicated by arrows 68 in FIG. 6D. Selection of the overlay material 65, its length and thickness permits the control of the resistance and therefore the coil Q while it is activated. This preferred embodiment RF switch when formed in a superconducting receiver coil as shown in FIG. 3B, 4 or 5 as it enables the Q factor of the resonator to be controlled during activation of RF switch power source.

Although the invention has been described herein in its preferred form, those skilled in the art will recognize that many changes and variations may be made thereto without departing from the spirit and scope of the invention as defined in the claims. For example, the RF switch power source may be incorporated directly into the NMR spectrometer making it possible to use a single coupling loop for coupling both the NMR spectrometer signals and the RF switch power source. Many different cryogenic multimode resonators could be used with the invention. To activate the RF switch, the current may only need approach the critical current to achieve sufficient Q-reduction or de-tuning to achieve the desired results.

What is claimed is:

1. A cryogenic resonator system, which is coupled to a NMR spectrometer and to a RF switch power source, comprising:
    a cryogenic multimode resonator having a first resonant mode resonating at a first resonant frequency tuned to an operating frequency of the NMR spectrometer and at least a second resonant mode resonating at a second frequency tuned to a frequency of the RF switch power source; and
    at least one superconducting RF switch formed within at least one section of said cryogenic multimode resonator, wherein RF current induced by the RF switch power source in said at least one superconducting RF switch approaches or exceeds a value of a critical RF current thereby increasing a resistance of said at least one superconducting RF switch and casing a reduction of a Q-factor of the cryogenic multimode resonator.

2. The cryogenic resonator system of claim 1, wherein the cryogenic multimode resonator and the superconducting RF switch are made of HTS material.

3. The cryogenic resonator system of claim 1, wherein the cryogenic multimode resonator is a transmitter resonator operating on a transmitter frequency by receiving a RF transmit pulse from the NMR spectrometer.

4. The cryogenic resonator system of claim 3, wherein the RF switch power source is activated at the end of the RF transmit pulse and before activation of an NMR spectrometer receiver to dissipate any remaining energy within the multimode resonator.

5. The cryogenic resonator system of claim 1, further comprising an additional cryogenic resonator coupled to the NMR spectrometer and tuned to the operating frequency of the NMR spectrometer.

6. The cryogenic resonator system of claim 1, further comprising an additional non-cryogenic resonator coupled to the NMR spectrometer, wherein said additional non-cryogenic resonator is a transmitter resonator and cryogenic multimode resonator is a receiver resonator.

7. The cryogenic resonator system of claim 5, wherein the additional cryogenic resonator is a transmitter resonator and the cryogenic multimode resonator is a receiver resonator.

8. The cryogenic resonator system of claim 5, wherein the additional cryogenic resonator is a receiver resonator and the multimode resonator is a transmitter resonator.

9. The cryogenic resonator system of claim 2, further comprising an additional HTS resonator coupled to the NMR spectrometer and tuned to the operating frequency of the NMR spectrometer.

10. The cryogenic resonator system of claim 5, wherein the additional cryogenic resonator is fabricated from a normal metal, which operates at cryogenic temperatures.

11. The cryogenic resonator system of claim 1, wherein said cryogenic multimode resonator comprises two identical inductively coupled resonators.

12. The cryogenic resonator system of claim 1, wherein said cryogenic multimode resonator is a spiral wound coil with distributed capacitance formed by a space between the windings.

13. The cryogenic resonator system of claim 1, wherein the superconducting RF switch is made of a patterned length of HTS material formed on a dielectric substrate, having a central region comprising a layer of a normal metal and disposed between end regions, the central region has a reduced cross-section compared with the end regions.

14. The cryogenic resonator system of claim 13, wherein a resistance of said superconducting RF switch while in non-superconducting state is controlled by geometrical parameters of the layer of the normal metal.

15. The cryogenic resonator system of claim 1, wherein said multimode cryogenic resonator comprises:
    a first cryogenic resonator having a series connection of a first inductive section, a first capacitive section and the superconducting RF switch, said first cryogenic resonator is tuned to the first frequency and coupled to the NMR spectrometer, and
    a second cryogenic resonator having a series connection of a second inductive section, a second capacitive section and the superconducting RF switch, said second cryogenic resonator is tuned to the second frequency and coupled to the RF switch power source.

16. A method of decreasing a Q-factor of a cryogenic multimode resonator with one resonant mode at a first frequency and a second resonant mode at a second frequency, where the first frequency is the resonant frequency of a NMR signal, the method comprising the steps of:
    forming at least one superconducting RF switch within the multimode resonator;
    coupling the multimode resonator to a NMR spectrometer and to a RF switch power source and tuning the RF switch power source to the second frequency;
    activating the RF switch power source for producing an RF current to flow in the cryogenic multimode resonator;
    converting a superconducting state of the at least one superconducting RF switch to a non-superconducting state by providing the value of RF current, which approaches or exceeds the critical current therein; and
    decreasing the Q-factor of the multimode resonator by increasing the resistance of the superconducting RF switch.

17. The method of claim 16, wherein the cryogenic multimode resonator is a transmitter and a receiver resonator.

18. The method of claim 17, further comprise the further steps of:
    applying a RF transmitter pulse to the multimode resonator; and
        activating the RF switch power source at the termination of the transmitter pulse and before a NMR spectrometer receiver is activated for dissipating any remaining transmitter RF energy within the multimode resonator.

19. The method of claim 16, further comprising providing an additional cryogenic resonator to serves as a transmitter resonator, wherein said cryogenic multimode resonator serves as the receiver resonator.

20. The method of claim 19, further comprising the steps of:
    coupling the additional cryogenic resonator to the NMR spectrometer;
    applying a RF transmitter pulse to the additional cryogenic resonator; and
    activating the RF switch power source during the transmitter pulse for decreasing any RF transmitter currents induced in said multimode resonator decreasing the RF fields produced by these RF currents.

21. The method of claim 16, further comprising providing an additional cryogenic resonator coupled to the NMR spectrometer to serve as a receive resonator, wherein said multimode resonator serves as a transmitter resonator.

22. The method of claim 21, further comprising the steps of:
    applying a transmitter RF pulse to the multimode resonator;
    activating the NMR spectrometer to receive after the termination of the transmitter RF pulse, and
    activating the RF switch power source during the activation period of the NMR spectrometer receiver for reducing any NMR signal currents induced into the multimode resonator during the receive period.

23. The method of claim 16, wherein the step of forming at least one superconducting RF switch comprises:
    patterning a length of HTS material formed on a dielectric substrate forming a central region with reduced cross-section between two end regions,
    depositing a normal metal on said central region; and
    adjusting the thickness of the layer of the normal metal deposit for controlling the resistance of the RF switch while in a non-superconducting state.

\* \* \* \* \*